United States Patent [19]
Holzer

[11] Patent Number: 5,594,390
[45] Date of Patent: Jan. 14, 1997

[54] REDUCED AREA, FIRST ORDER R-C FILTERS USING CURRENT CONVEYORS

[75] Inventor: Reuven Holzer, Herzlia, Israel

[73] Assignee: National Semiconductor Corporation, Del.

[21] Appl. No.: 563,065

[22] Filed: Nov. 27, 1995

[51] Int. Cl.⁶ .................. H03L 7/093; H03K 5/13; H03H 11/04; H03H 11/12
[52] U.S. Cl. .................. 331/17; 331/8; 327/553; 327/558; 360/51
[58] Field of Search .................. 331/8, 17, 25, 331/34; 327/552–559; 333/167, 172; 360/30, 51

[56] References Cited

U.S. PATENT DOCUMENTS

| | | |
|---|---|---|
| Re. 28,452 | 6/1975 | Lance .......................... 331/17 |
| 3,909,735 | 9/1975 | Anderson et al. ............... 331/17 X |
| 4,338,527 | 6/1982 | Nagano . |
| 4,387,348 | 6/1983 | Fritze ......................... 331/17 |
| 4,983,930 | 1/1991 | Wadsworth . |
| 5,012,133 | 4/1991 | Hughes . |
| 5,028,822 | 7/1991 | Hughes . |
| 5,055,719 | 10/1991 | Hughes . |
| 5,109,169 | 4/1992 | Hughes . |
| 5,121,085 | 6/1992 | Brown ......................... 331/17 X |
| 5,124,666 | 6/1992 | Liu et al. . |
| 5,138,278 | 8/1992 | Stessen . |
| 5,206,541 | 4/1993 | Boahen et al. . |
| 5,384,502 | 1/1995 | Volk ........................... 331/17 X |
| 5,410,271 | 4/1995 | Arbel . |
| 5,504,459 | 4/1996 | Gersbach et al. ............... 331/17 |

OTHER PUBLICATIONS

National Semiconductor Data Book, "Floppy Disk Data Separator Design Guide for the DP8473", National Semiconductor Application Note 505, Lutz et al, date unknown, pp. 5–28 to 5–57.

*Primary Examiner*—David Mis
*Attorney, Agent, or Firm*—Skjerven, Morrill, MacPherson, Franklin and Friel; Paul J. Winters; David T. Millers

[57] ABSTRACT

An active filter includes a capacitor and a resistor coupled in parallel to an input terminal; a first current conveyor coupled between the capacitor and an output terminal; a second current conveyor coupled between the resistor and the output terminal; and a second capacitor coupled between the output terminal and ground. Proportionality constants between input and output currents of the current conveyors can be adjusted to reduce capacitance in the active filter and reduce the area required to fabricate the active filter in an integrated circuit. The active filter can replace a conventional loop filter in a phase-locked loop of a data separator integrated circuit. In a phase-locked loop, the polarity of a charge pump can be reversed to compensate for current reversal by the current conveyors in the active filter.

12 Claims, 3 Drawing Sheets

REDUCED AREA, FIRST ORDER R-C FILTERS USING CURRENT CONVEYORS

BACKGROUND OF THE INVENTION

1. Field of the Invention

This invention relates to circuits for filtering AC signals and to integrated circuits such as analog data separators and phase-locked loops containing active filters.

2. Description of Related Art

A variety of applications use filter circuits to remove unwanted frequency components from AC signals. One such application is a data separator containing a loop filter in a phase-locked loop. A data separator in a disk drive generates a data signal and a read clock signal from encoded pulses that a read head generates when reading a track on a disk. FIG. 1 illustrates the functional blocks in an exemplary data separator 100 which is a DP8473 available from National Semiconductor Corp. "The Floppy Disk Data Separator Design Guide for the DP8473," Application Note 505 describes the DP8473 data separator and is incorporated by reference herein in its entirety.

Data separator 100 contains a primary phase-locked loop 110 which generates a signal RCLK that is phase-locked to clock pulses in a signal Read_Data_In. Signal Read_Data_In typically contains clock pulses and data pulses that a read head generates while following a track, and the clock and data pulses have timing according to an encoding technique, typically frequency modulation (FM) or modified frequency modulation (MFM). A signal ENABLE to a phase comparator 112 indicates which of the pulses passing through a multiplexer 130 are clock pulses. Phase comparator 112 compares an edge of each clock pulse to a corresponding edge in signal RCLK and generates pump up and pump down signals which cause a charge pump 114 to either pump up (increase) a voltage VCNTL or pump down (decrease) the voltage VCNTL.

Voltage VCNTL is applied through a node 115 to a voltage controlled oscillator (VCO) 116 so that VCO 116 and a programmable divider 118 generate signal RCLK at a frequency that follows voltage VCNTL. A filter 120 removes high frequency components from voltage VCNTL to reduce jitter in signal RCLK and increase the ability of data separator 100 to accurately identify data. Filter 120 contains a capacitor 121 coupled between node 115 and ground and a capacitor 122 and a resistor 123 coupled in series between node 115 and ground. The filter response $(V/I)_s$ of filter 120 is approximately equal to $$(1+S*R1*C1)/[S*(C1+C2)*\{1+S*R1*C1*C2/(C1+C2)\}]$$

where S is the angular frequency of a voltage component applied to filter 120; R1 is the resistance of resistor 123; and C1 and C2 are the capacitances of capacitors 121 and 122.

Values R1, C1, and C2 are selected for the data rate (i.e. the frequency of the read clock signal). In an exemplary embodiment, capacitors 121 and 122 have respective capacitance of 1265 pF and 63 pF; and resistor 123 is a variable resistor having selectable resistances including 36.64 KΩ, 18.1 KΩ, and 8.58 KΩ corresponding to data rates of 250 KHz, 500 KHz, and 1000 KHz respectively. Filter 120 can be formed as part of an integrated circuit containing data separator 100. However, the total capacitance of filter 120 (about 1330 pF in the exemplary embodiment) requires a relatively large area (about 1.4 to 1.9 kmil$^2$ drawn at 1 μm design rules).

SUMMARY OF THE INVENTION

An embodiment of the invention uses a class II current conveyor in an active filter to provide the same filter response as a conventional low pass filter. Parameters of the active filter can be optimized to minimize the required capacitance for a desired filter response and greatly reduce the semiconductor area required to fabricate the active filter when compared to conventional filters. One embodiment of the active filter includes a capacitor and a resistor coupled in parallel to an input terminal. A first current conveyor is coupled between the capacitor and an output terminal, and a second current conveyor is coupled between the resistor and the output terminal. A second capacitor is coupled between the output terminal and a reference voltage. The current conveyors generate currents which are proportional to the currents through the resistor and the first capacitor, and the proportionality constants of the current conveyors are selected to minimize total capacitance for a desired filter response.

The active filter can replace a conventional loop filter in a phase-locked loop in an analog data separator integrated circuit (IC). In one such embodiment, current flowing into an input terminal of the active filter causes current flowing into the output terminal of the active filter. Accordingly, in a phase-locked loop, the polarity of a charge pump is reversed so that the charge pump provides a current pulse that reduces the voltage at the input terminal of the active filter to thereby increase the voltage at the output terminal of the filter and increase the voltage to a voltage control oscillator in the phase-locked loop.

BRIEF DESCRIPTION OF THE DRAWINGS

Use of the same reference symbols in different figures indicates similar or identical items.

DETAILED DESCRIPTION OF THE PREFERRED EMBODIMENTS

An embodiment of the invention uses class II current conveyors in a filter to reduce the capacitance required to provide a desired filter response. The reduction in capacitance reduces the semiconductor area required to implement the filter in an integrated circuit and thus tends to reduce the cost of circuits containing such filters.

Figure 2:
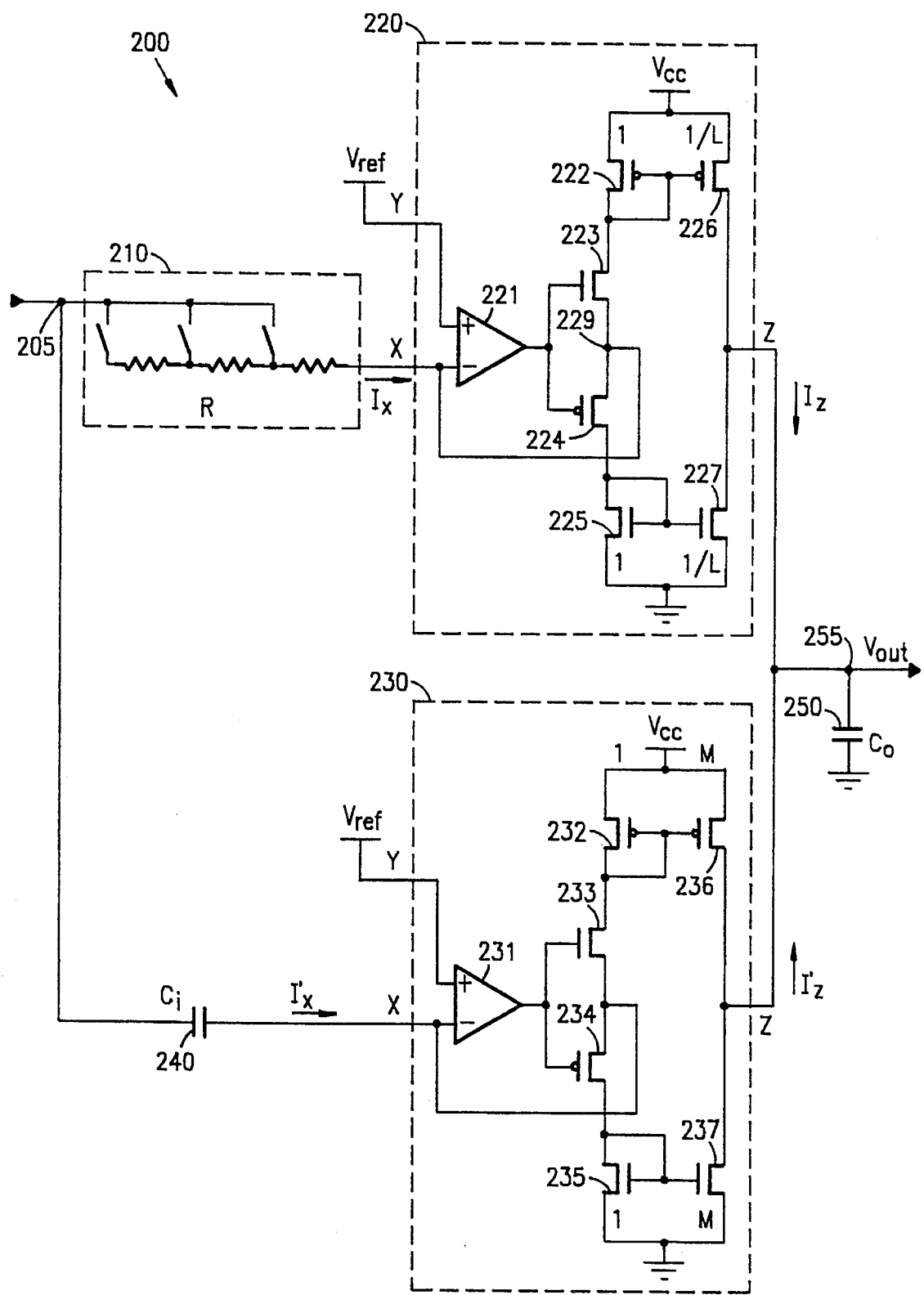
FIG. 2 shows a filter circuit in accordance with an embodiment of the invention.

FIG. 2 shows a filter 200 in accordance with an embodiment of the invention. The elements of filter 200 are well known in the art and can be formed as discrete components or as portions of an integrated circuit. In one embodiment, filter 200 is a loop filter in a phase-locked loop which is part of a data separator IC formed using a conventional process such as conventional CMOS or bipolar processing. Filter 200 includes a resistor 210, class II current conveyors 220 and 230, and capacitors 240 and 250. Resistor 210 is coupled in series with current conveyor (CCII) 220 between an input node 205 and an output node 255. Capacitor 240 is coupled in series with CCII 230 between input node 205 and output node 255. Capacitor 250 is coupled between output node 255 and a reference voltage (ground).

Current conveyors are known circuit elements with defined ideal relations between currents and voltages on three terminals X, Y, and Z. In an ideal current conveyor, a current Iz out of terminal Z of a current conveyor is equal to a proportionality constant K multiplied by a current Ix into terminal X. FIG. 2 shows specific implementations of current conveyors 220 and 230, but other implementations may be employed. For example, U.S. Pat. No. 5,124,666, entitled "CMOS CURRENT CONVEYOR AND ITS FILTER APPLICATIONS", describes alternative current conveyor implementations and is incorporate by reference herein in its entirety. Circuitry shown inside CCIIs 220 and 230 in FIG. 2 illustrates the principles of operation of current conveyors, but other implementations such as those described in U.S. Pat. No. 5,124,666 may provide more efficient CCIIs.

In FIG. 2, CCII 220 contains an operational amplifier (op-amp) 221, P channel transistors 222, 224, and 226, and N channel transistors 223, 225, and 227. Transistors 222 to 225 are connected in series between a supply voltage Vcc and ground with the gates of transistors 223 and 224 coupled to the output terminal of op-amp 221. Transistors 226 and 227 are also connected in series between supply voltage Vcc and ground. The gate of P channel transistor 226 is coupled to the gate and drain of P channel transistor 222 so that the saturation current through transistor 226 mirrors the current through transistor 222. Similarly, the gate of N channel transistor 227 is coupled to the gate and drain of N channel transistor 225 so that the saturation current through transistor 227 mirrors the current through transistor 225.

In CCII 220, terminal X is a negative input terminal of op-amp 221 which is coupled to a node between transistors 223 and 224. Terminal Y is a positive terminal of op-amp 221. A reference voltage source (not shown) which imposes a DC operating voltage on charge pump 114 keeps terminal Y at a reference voltage Vref. For an ideal op-amp 221 with very large amplification, the voltage difference between terminal Y and terminal X is small; and the voltage Vx at terminal X is about equal to Vref. Terminal Z is a node between transistors 226 and 227 and is coupled to output node 255.

When a voltage Vin at node 205 increases, current Ix into, and voltage Vx at terminal X of CCII 220 increase. The output voltage of op-amp 221 drops which turns off transistor 223 and turns on transistor 224 so that current Ix flows through transistors 224 and 225. Since current through transistor 227 mirrors current through transistor 225, current Iz, which flows from output node 255 through transistor 227, is proportional to current Ix with the proportionality constant depending on the relative dimensions of transistors 225 and 227. For example, if transistors 225 and 227 differ only in channel widths, the magnitude of the proportionality constant is the ratio of the channel widths.

When an input voltage Vin at node 205 decreases, current Ix and voltage Vx decrease. The output voltage of op-amp 221 increases which turns on transistor 223 and turns off transistor 224 so that current through transistors 222 and 223 flows out through terminal X. Since current Iz, which flows through transistor 226, mirrors current through transistor 222 and is proportional to current Ix with a proportionality constant depending on the relative dimensions of transistors 222 and 226.

CCII 230 contains an op-amp 231 and transistors 232 to 237 which operate in the same manner as op-amp 221 and respective transistors 222 to 227 described above in regard to CCII 220. CCII 230 differs from CCII 220 in that capacitor 240, not a resistor, couples CCII 230 to input node 205 and in that the dimensions of transistors in CCII 230 differ from the dimensions of transistors in CCII 220. In CCII 220, the dimensions of transistors 225 and 227 and transistors 222 and 226 are selected so that $Iz=-(1/L)*Ix$. In CCII 230, the dimensions of transistors 235 and 237 and transistors 232 and 236 are selected so that $Iz'=-M*Ix'$. The negative proportionality constants, $-1/L$ and $-M$, indicate that when a current pulse pumps up voltage Vin, CCIIs 220 and 230 pump down voltage Vout.

Figure 1:
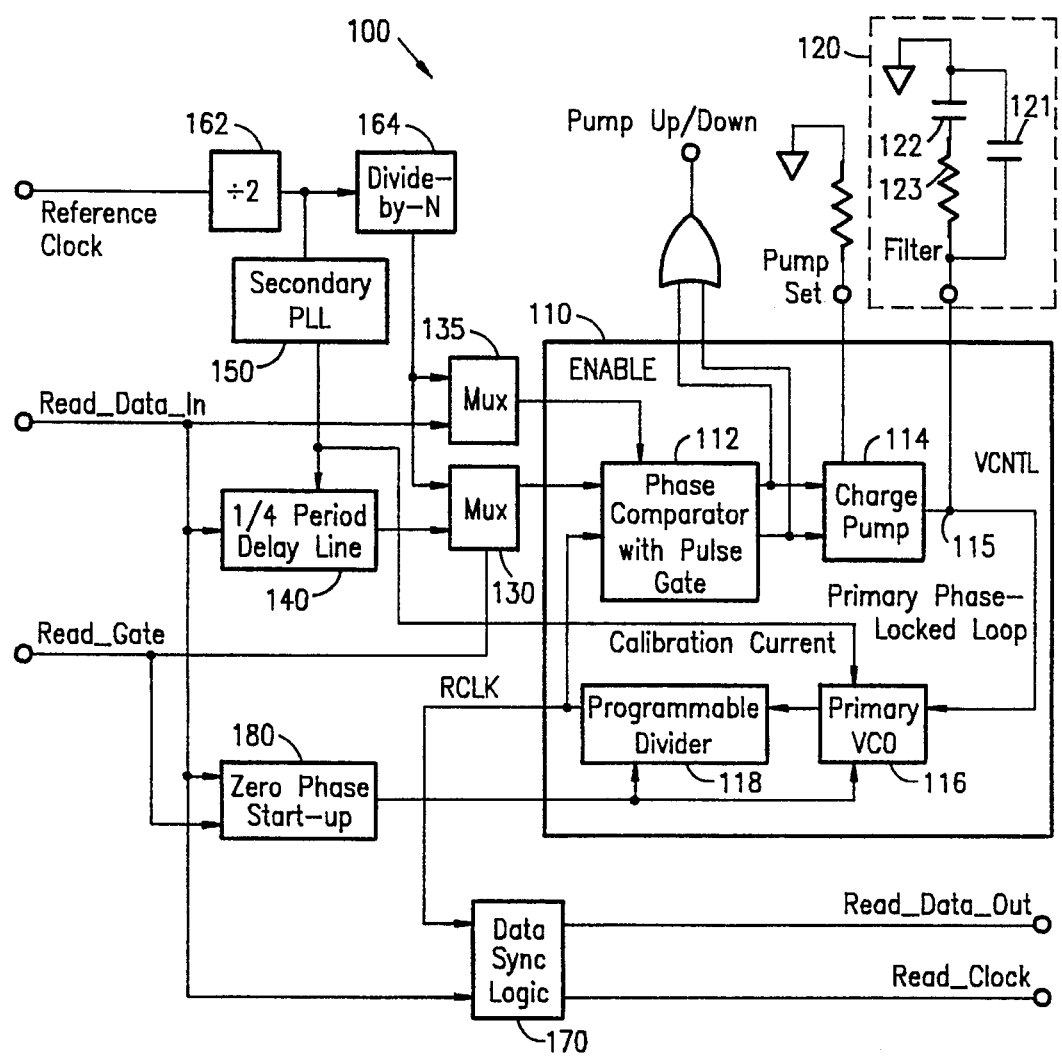
FIG. 1 shows a block diagram of a data separator which includes a low pass filter.

Filter 200 has a filter response $(Vout/I)_s$ given by $$-(1+S*R*Ci*L*M)/[S*L*Co*(1+S*R*Ci)]$$

where S is the angular frequency of a component of voltage Vin; R is the resistance of resistor 210; and Ci and Co are the respective capacitances of capacitors 240 and 250. Aside from a difference in sign, the filter response $(Vout/I)_s$ of filter 200 is the same as the filter response $(V/I)_s$ of filter 120 of FIG. 1, $(1+S*R1*C1)/[S*(C1+C2)*\{1+S*R1*C1*C2/(C1+C2)\}]$, if $R*Ci*L*M=R1*C1$, $L*Co=C1+C2$, and $R*Ci=R1*C1*C2/(C1+C2)$. Standard calculus can simultaneously solve these equations under the condition that the total capacitance, $Ci+Co$, be minimized.

Selecting current ratios M and L equal to 1 and 21 respectively, resistance R equal to resistance R1, and capacitances Ci and Co each equal to 60 pF provides filter 200 with a filter response that matches that of the exemplary embodiment of filter 120 where capacitances C1 and C2 are 1265 pF and 63 pF respectively and resistance R1 is 36.64 KΩ, 18.1 KΩ, or 8.58 KΩ. Accordingly, the total capacitance of filter 200 (120 pF) is less than a tenth of the total capacitance of the exemplary embodiment of filter 120. In a typical integrated circuit fabricated using 1 μm design rules and a standard CMOS process, semiconductor area for capacitors is reduced from about 1.9 kmil$^2$ for filter 120 to about 0.17 kmil$^2$ for filter 200. Using the same design rules, the semiconductor area required to fabricate current conveyors 220 and 230 is about 0.25 kmil$^2$. Accordingly, using a typical manufacture process, filter 200 requires 1.5 kmil$^2$ less silicon area than does filter 120. Similar savings in semiconductor area can be achieve using a bipolar implementation of current conveyors 220 and 230.

Figure 3:
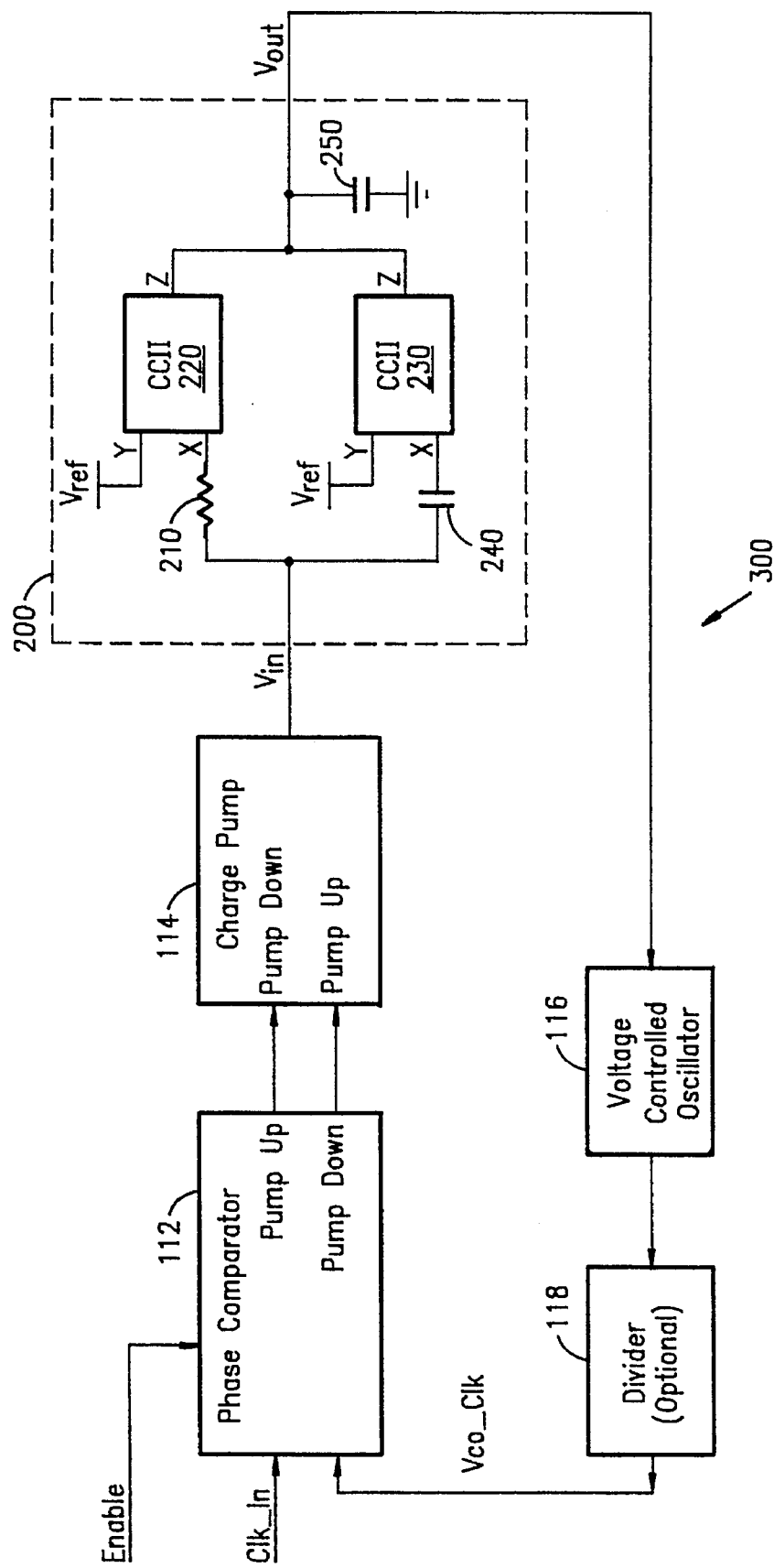
FIG. 3 shows a block diagram of a phase-locked loop in accordance with an embodiment of the invention.

FIG. 3 shows a block diagram of an application of filter 200 in a phase-locked loop (PLL) 300. PLL 300 can be used in place of primary PLL 110 in data separator 100 of FIG. 1. PLL 300 contains phase comparator 112, charge pump 114, voltage controlled oscillator 116, and optionally divider 118, as in PLL 110, but the polarity of charge pump 114 is reversed relative to phase comparator 112 to compensate for the inversion caused by filter 200. In particular, when phase comparator 112 detects that the phase of a signal VCO_CLK leads a signal CLK_IN, phase comparator 112 generates signals which indicate that voltage Vout to VCO 116 should be decreased. In response, charge pump 114 pumps up voltage Vin so that filter 200 decreases voltage Vout. Charge pump 114 pumps down voltage Vin to increase voltage Vout.

If current conveyors 220 and 230 are replace with current conveyors having current relations $Ix=(1/L)*Ix$ and $Iz'=M*Ix'$, the polarity of charge pump 114 need not be reversed from the polarity used in PLL 110.

Although the present invention has been described with reference to particular embodiments, the description is only an example of the invention's application and should not be taken as a limitation. In particular, even though specific circuits were described for current conveyors used in an embodiment of invention, the actual implementation of the current conveyors is not critical to the invention; and any circuit or device which provides a current Iz which equals an input current Ix times a proportionality constant (positive or negative) may be employed. Various other adaptations and combinations of features of the embodiments disclosed are within the scope of the invention as defined by the following claims.

I claim:

1. A filter comprising:

an input terminal;

an output terminal;

a first capacitor coupled to the input terminal;

a first current conveyor coupled between the first capacitor and the output terminal;

a resistor coupled to the input terminal;

a second current conveyor coupled between the resistor and the output terminal; and a second capacitor coupled between the output terminal and ground.

2. The filter of claim 1, wherein:

the first current conveyor provides an output current having a magnitude equal to a constant K1 times the magnitude of a current through the first capacitor;

the second current conveyor provides an output current having a magnitude equal to a constant K2 times the magnitude of a current through the resistor; and the constants K1 and K2 and a resistance of the resistor are selected to minimize a sum of capacitances of the first and second capacitors.

3. The filter of claim 1, wherein a current directed into the input terminal of the filter causes a current directed into the output terminal of the filter.

4. The filter of claim 1, wherein the filter is part of a monolithic integrated circuit.

5. The filter of claim 1, wherein each of the first and second current conveyors comprises:

an amplifier having a positive input terminal coupled to a reference voltage;

a first P channel transistor, a first N channel transistor, a second P channel transistor, and a second N channel transistor connected in series between a supply voltage terminal and ground, wherein gates of the first N channel transistor and the second P channel transistor are coupled to an output terminal of the amplifier, and a node between the first N channel transistor and the second P channel transistor is coupled to a negative input terminal of the amplifier; and a third P channel transistor and a third N channel transistor connected in series between the supply voltage terminal and ground, wherein a gate of the third P channel transistor is coupled to a gate and a drain of the first P channel transistor, and a gate of the third N channel transistor is coupled to a gate and a drain of the second N channel transistor, wherein the current conveyor has an input terminal coupled to the negative input terminal of the amplifier and an output terminal coupled to a node between the third P channel transistor and the third N channel transistor.

6. The filter of claim 5, wherein in at least one of the current conveyors, a dimension of the first P channel transistor differs from a corresponding dimension of the third P channel transistor.

7. The filter of claim 6, wherein a dimension of one of the transistors in the first current conveyor differs from a corresponding dimension of a corresponding one of the transistors in the second current conveyor, the difference being selected to minimize a total capacitance of the first and second capacitors required to provide a desired filter response.

8. A filter comprising:

an input terminal and an output terminal;

a first capacitor coupled to the input terminal;

a resistor coupled to the input terminal;

means for providing a first current having a magnitude equal to a constant K1 times the magnitude of a current through the first capacitor;

means for providing a second current having a magnitude equal to a constant K2 times the magnitude of a current through the resistor; and a second capacitor coupled between the output terminal and a reference voltage, wherein the second capacitor and the first and second currents control an output voltage at the output terminal.

9. The filter of claim 8, wherein the constants K1 and K2 and a resistance of the resistor are selected to minimize a sum of capacitances of the first and second capacitors.

10. A phase-locked loop comprising:

a loop filter which includes: an input terminal and an output terminal; a first capacitor coupled to the input terminal; a first current conveyor coupled between the first capacitor and the output terminal; a resistor coupled to the input terminal; a second current conveyor coupled between the resistor and the output terminal; and a second capacitor coupled between the output terminal and a reference voltage;

a voltage controlled oscillator coupled to the output terminal of the loop filter;

a phase comparator coupled to the voltage controlled oscillator; and a charge pump coupled to the phase comparator and to the input terminal of the loop filter, wherein the charge pump pumps up a voltage on the input terminal of the loop filter in response to a signal from the phase comparator indicating that a voltage to the voltage controlled oscillator should be decreased.

11. The phase-locked loop of claim 10, further comprising a programmable divider, where in the phase comparator is coupled to the voltage controlled oscillator through the programmable divider.

12. The phase-locked loop of claim 10, wherein the phase-locked loop is a portion of an integrated circuit which forms an analog data separator.

* * * * *